United States Patent [19]

Rinderle

[11] Patent Number: 4,614,916

[45] Date of Patent: Sep. 30, 1986

[54] CIRCUIT FOR TRANSFORMING DIRECT-CURRENT SIGNALS

[75] Inventor: Heinz Rinderle, Heilbronn, Fed. Rep. of Germany

[73] Assignee: Telefunken Electronic GmbH, Heilbronn, Fed. Rep. of Germany

[21] Appl. No.: 637,031

[22] Filed: Aug. 2, 1984

[30] Foreign Application Priority Data

Aug. 17, 1983 [DE] Fed. Rep. of Germany ....... 3329664

[51] Int. Cl.[4] ............................................. H03F 3/04
[52] U.S. Cl. ................................... 330/289; 330/288
[58] Field of Search ............... 330/288, 289, 256, 257; 307/310

[56] References Cited

U.S. PATENT DOCUMENTS

| | | | |
|---|---|---|---|
| 3,893,018 | 7/1975 | Marley | 322/19 |
| 3,955,108 | 5/1976 | Beck | 330/289 |
| 4,450,414 | 5/1984 | Patterson | 330/288 |

FOREIGN PATENT DOCUMENTS

| | | |
|---|---|---|
| 2302092 | 7/1974 | Fed. Rep. of Germany . |
| 2059756 | 6/1976 | Fed. Rep. of Germany . |
| 2646366 | 4/1977 | Fed. Rep. of Germany . |

OTHER PUBLICATIONS

Robert J. Widlar, an article from IEEE Journal of Solid-State Circuits, entitled "New Developments in IC Voltage Regulators", vol. SC-6, No. 1, 1971, pp. 2–7.
Karel E. Kuijk, an article from IEEE Journal of Solid-State Circuits, entitled "A Precision Reference Voltage Source", vol. SC-8, No. 3, 1973, pp. 222–226.
IEEE Journal of Solid-State Circuits, vol. SC-12, No. 6, 1977, p. 660, FIG. 10.
IEEE Journal of Solid-State Circuits, Dec. 1975, pp. 434 and 435, FIG. 5.
Jim McDaniel, an article from Electronics, entitled "HP-67/97 Program Performs Current-Mirror Analysis", pp. 152 and 153, Figure.

Primary Examiner—Gene Wan
Attorney, Agent, or Firm—Spencer & Frank

[57] ABSTRACT

In a circuit for transforming direct-current signals whose output signal is dependent on the input signal, the temperature variation of the output signal is adjustable, and two transistors whose base-emitter sections exhibit an appropriate voltage difference are provided for control of the temperature variation of the output current.

21 Claims, 26 Drawing Figures

CIRCUIT FOR TRANSFORMING DIRECT-CURRENT SIGNALS

BACKGROUND OF THE INVENTION

In many electronic control circuits signal transformations are required to provide signals with a certain reproducible temperature variation. These circuits should also be able to compensate a temperature variation, more particularly, throughout the entire control range. Such control circuits are required, for example, for the electronic control of amplifiers or for the generation of a defined charging current of capacitors.

SUMMARY OF THE INVENTION

The object underlying the invention is to provide a circuit for transforming direct-current signals whose temperature variation is adjustable and whose output signal may be made temperature-independent. According to the invention, the temperature variation of the output signal in a circuit for transforming direct-current signals is adjustable and two transistors whose base-emitter sections exhibit an appropriate voltage difference are provided for control of the temperature variation of the output current.

The voltage difference is generated, for example, by a voltage source between the bases or the emitters of the two transistors. In accordance with a further development of the invention, a further direct-current signal transformer is connected downstream of the two transistors and causes its output current to be exponentially dependent on its input current.

BRIEF DESCRIPTION OF THE DRAWINGS

The invention will now be described in greater detail, by way of examples, with reference to the drawings, in which.

DESCRIPTION OF THE PREFERRED EMBODIMENTS

Figure 1:
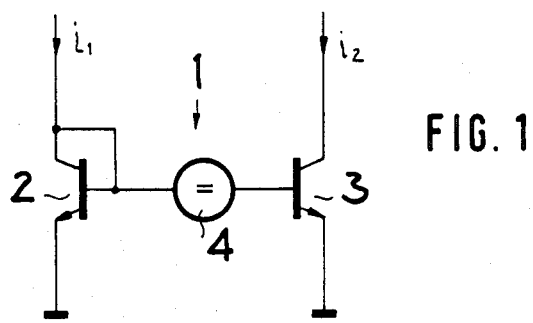
FIG. 1 is a circuit schematic showing a direct-current transformer according to one embodiment of the invention.

FIG. 1 shows a direct-current transformer 1 with transistors 2 and 3. In the input transistor 2, the base is connected to the collector. The temperature variation of the current mirror relationship $i_2/i_1$ is set by a voltage difference between the bases of the two transistors 2 and 3. The voltage difference is symbolized by a voltage source 4. A real voltage source, a current source with resistor or a voltage source with voltage divider may be used as voltage source.

Figure 2:
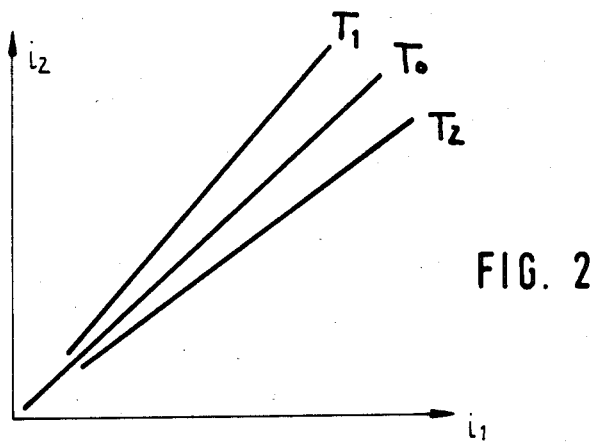
FIG. 2 is a characteristic diagram showing the dependency of the output current relative to FIG. 1 on the input current.

FIG. 2 shows the dependency of the output current $i_2$ on the input current $i_1$ with the temperature as parameter. In the diagram of FIG. 2, $T_o$ is the reference temperature. In FIG. 2, $T_1$ is larger than the reference temperature $T_o$, whereas the temperature $T_2$ is smaller than the reference temperature $T_o$. The characteristic lines of FIG. 2 are obtained on the condition that the base-emitter voltage of the mirror transistor 3 is smaller than that of the mirror transistor 2. This is attained by the size and direction of the voltage of the voltage source 4. The temperature dependency of the output current $i_2$ runs in the opposite direction when the polarity of the voltage source 4 is reversed.

Figure 3:
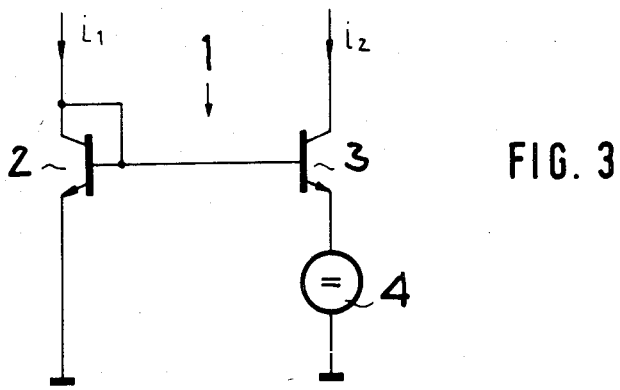
FIG. 3 is a circuit schematic showing another embodiment of the circuit according to the invention.

FIG. 3 shows an embodiment of the circuit according to the invention with the transistors 2 and 3, wherein a voltage source 4 is connected between the emitter of the transistor 3 and the reference point (ground). The voltage source 4 provides the voltage difference required in accordance with the invention between the base-emitter sections of the two transistors 2 and 3. The voltage source 4 could, of course, also be inserted in the emitter section of the other transistor 2.

Figure 4:
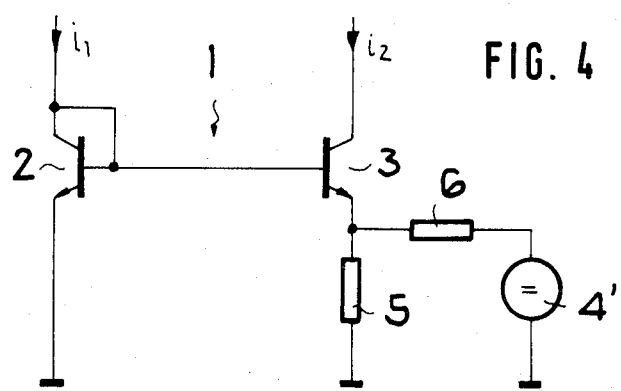
FIG. 4 illustrates a circuit schematic for generating the required voltage difference in FIG. 3.

While FIG. 3 shows only symbolically the generation of the required voltage difference, FIG. 4 shows how the required voltage difference is generated, for example, in one practical application. In accordance with FIG. 4, the voltage difference is generated by a voltage divider consisting of te resistors 5 and 6. The voltage divider is supplied by the voltage source 4' in accordance with FIG. 4. The voltage divider ratio and the size of the voltage of the voltage source 4' are to be selected so as to produce such a voltage difference between the two emitters of the transistors 2 and 3 that a certain temperature variation of the current relationship $i_2/i_3$ is obtained for the circuit. In order to keep down the influence of the emitter current of the transistor 3 on the voltage difference, the resistance value of the parallel connection comprising resistors 5 and 6 is to be selected correspondingly low.

Figure 5:
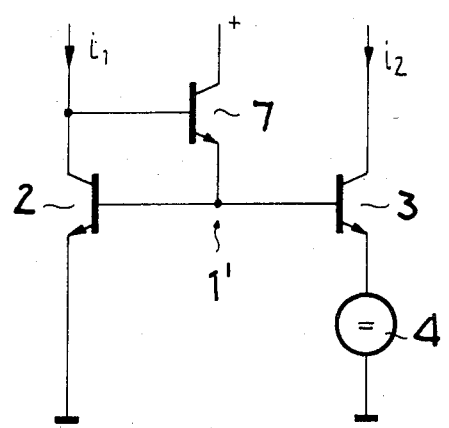
FIG. 5 is a circuit schematic similar to FIG. 3 showing a transistor connected via its base-emitter section between the collector and base of one of the transistors in FIG. 3.

The circuit 1' of FIG. 5 differs from the circuit of FIG. 3 in that in the transistor 2 the collector and the base are not directly connected, but via the base-emitter section of a further transistor 7.

Figure 6:
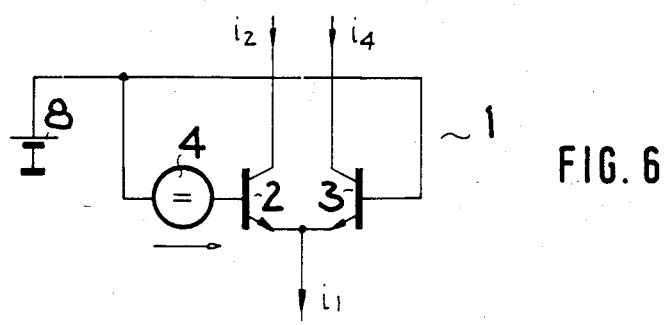
FIG. 6 is a circuit schematic according to another embodiment of the invention wherein the input current is fed to the emitters of the two transistors.

In the circuit of FIG. 6, the input current $i_1$ is fed to the emitters of the two transistors 2 and 3. The circuit of FIG. 6 supplies two output currents $i_2$ and $i_4$. The voltage difference provided in accordance with the invention is generated between the bases of the transistors 2 and 3 (symbolized by the voltage source 4). The voltage source 8 ensures that the emitter potential of the transistors 2 and 3 is higher than the reference potential. The temperature variation of the output currents $i_2$ and $i_4$ runs in the opposite direction to that of the input current $i_1$.

Figure 7:
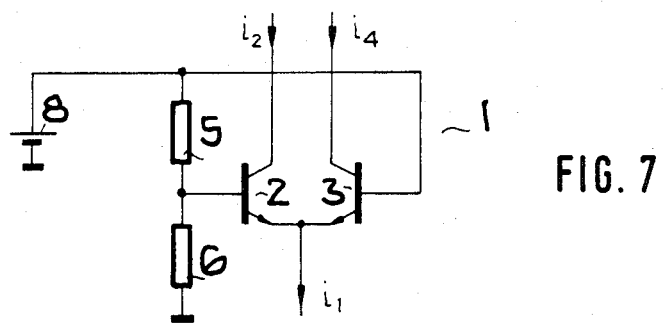
FIG. 7 is a circuit schematic showing, with respect to FIG. 6, the generation of the required voltage difference by a voltage divider with resistors.

The circuit of FIG. 7 differs from the circuit of FIG. 6 in that a voltage divider with resistors 5 and 6 is provided to generate the voltage difference.

Figure 8:
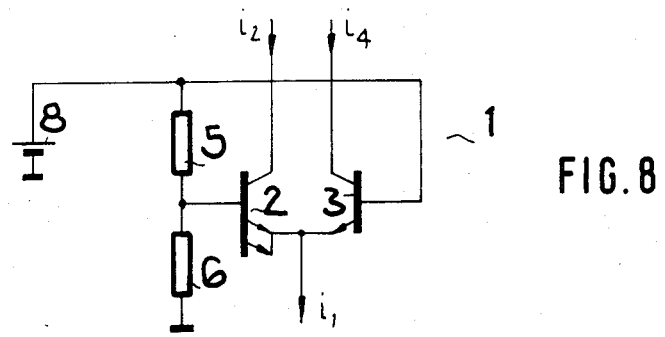
FIG. 8 illustrates a circuit similar to FIG. 7 and showing the transistors with differently dimensioned emitter surfaces.

In the circuit of FIG. 8, the emitter cross-sections of the two transistors 2 and 3 are differently dimensioned. The larger emitter dimensioning of the transistor 2 ensures that the output current $i_2$ reduced by the voltage difference is raised in comparison to the output current $i_4$.

Figure 9:
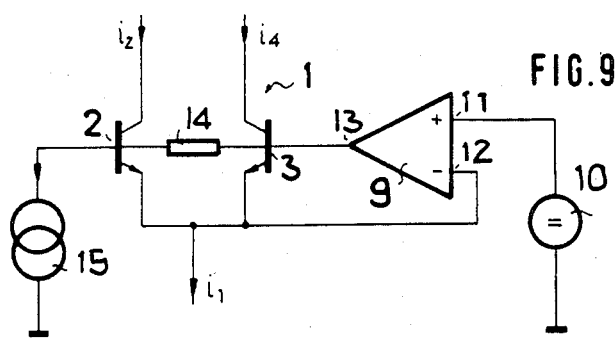
FIG. 9 is a circuit schematic according to a further embodiment of the invention which includes a control circuit.

The circuit of FIG. 9 comprises a control circuit consisting of the operational amplifier 9 and the voltage source 10. The non-inverting input 11 of the operational amplifier 9 is connected to the voltage source 10. The other end of the voltage source 10 is connected to the reference point. The non-inverting input 12 of the operational amplifier 9 is connected to the emitters of the transistors 2 and 3. The output 13 of the operational amplifier 9 is connected to the base of the transistor 3. The control circuit causes the potential at the emitters of the transistors 2 and 3 to equal the potential of the voltage source 10. Equality of the two potentials ensures that the control signal $i_1$ is independent of other circuit influences.

Figure 10:
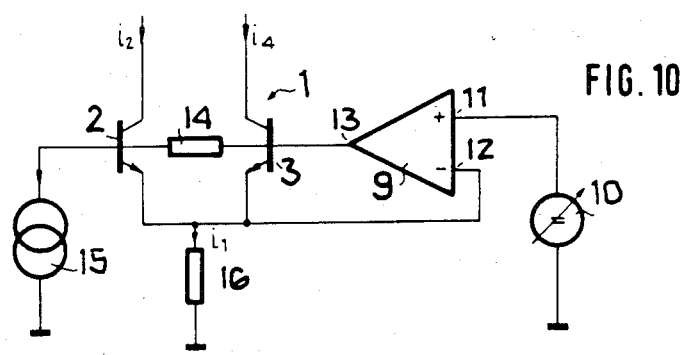
FIG. 10 a circuit schematic similar to FIG. 9 illustrating a further feature an example wherein the size of the current $i_1$ is determined by a resistor.

The circuit of FIG. 10 differs from the circuit of FIG. 9 in that there is connected between the emitters of the transistors 2 and 3 and the reference point a resistor 16 which determines the size of the current $i_1$. The voltage source 10 of the circuit of FIG. 10 is adjustable, whereby the input current $i_1$ is also controllable.

Figure 11:
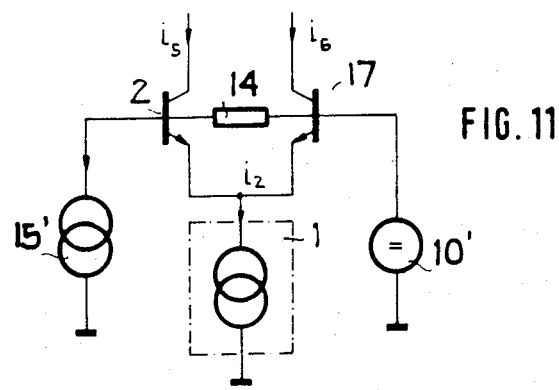
FIG. 11 is a circuit schematic according to a further aspect of the invention wherein a second direct-current signal transformer is provided for additional transformation of the output current.

In a circuit of FIG. 11, there is provided in addition to the direct-current signal transformer 1 a second direct-current signal transformer 17 which effects additional transformation of the output current (temperature dependency). The use of two or more direct-current signal transformers enables the linearity of the temperature dependency to be increased or a greater temperature dependency with the same linearity to be attained. The temperature variation of the output currents $i_5$ and $i_6$ runs in the opposite direction of that of the current $i_2$.

Figure 12:
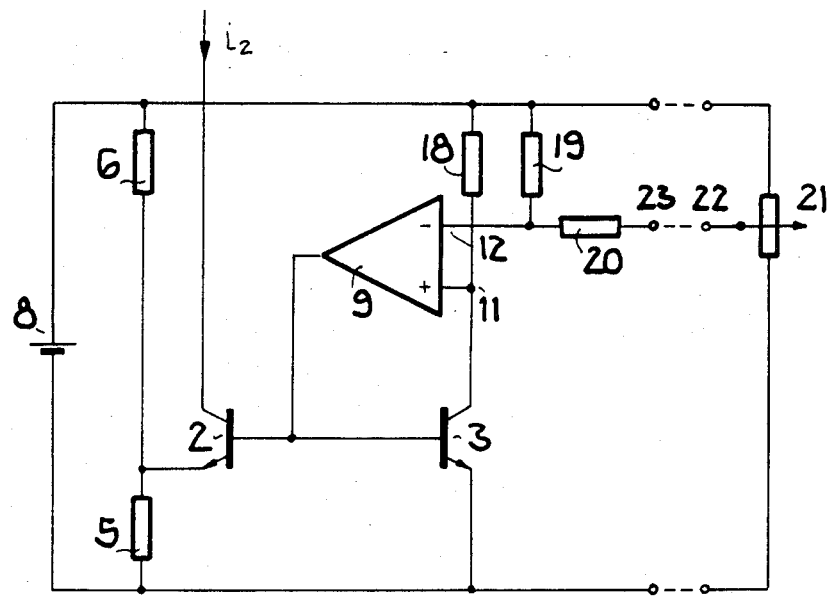
FIG. 12 is a circuit schematic of a transformer circuit according to the invention which includes a control circuit comprising an operational amplifier, a transistor and resistors.

The arrangement of FIG. 12 comprises a control circuit consisting of the operational amplifier 9, the transistor 3 and the resistors 18, 19 and 20. The inverting input 12 of the operational amplifier 9 is supplied with the control signal which is divided by the voltage divider consisting of the resistors 19 and 20. The non-inverting input 11 of the operational amplifier 9 is supplied with a potential which is determined by the collector current of the transistor 3, by the size of the resistance 18 and by the potential of the voltage source 8. The resistor 18 is connected between the non-inverting input 11 of the operational amplifier 9 and the positive potential of the voltage source 8. The temperature dependency of the output current $i_2$ of the transistor 2 is created by the emitter of the transistor 2 exhibiting by means of the voltage divider 5, 6 and the voltage source 8 a potential which is different from that of the emitter of the transistor 3. The size of the temperature dependency is determined by the size of this potential difference.

The output current $i_2$ is controlled by, for example, a potentiometer 21 being connected in parallel to with voltage source 8, with the slider 22 of the potentiometer 21 being connected to the input terminal 23 of the circuit according to FIG. 12.

Figure 13A:
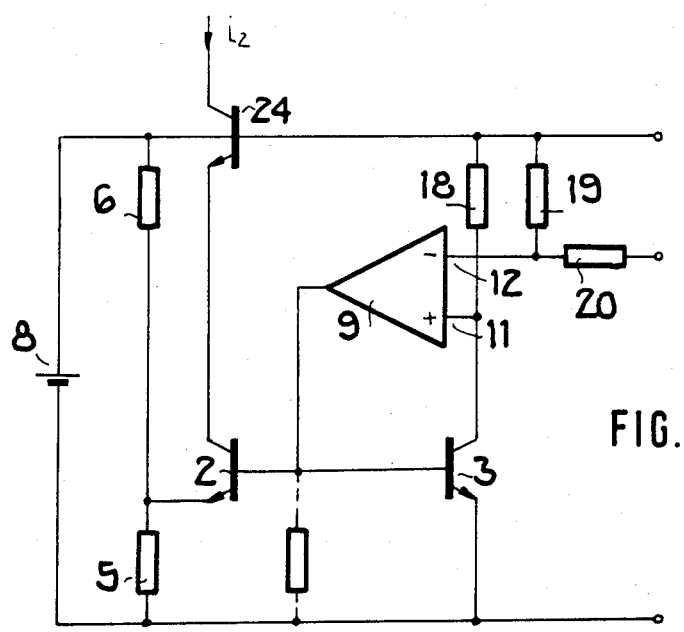
FIG. 13a shows a circuit similar to that of FIG. 12 with an additional transistor.

The circuit of FIG. 13a differs from the circuit of FIG. 12 in that there is provided, in addition, a transistor 24 whose emitter is connected to the collector of the transistor 2. The base of this transistor is connected to a constant potential. The task of the transistor 24 is to keep the collector-emitter voltage of the transistor 2 constant. The output current $i_2$ is thereby substantially independent of changes in the output potential (collector of the transistor 24).

Figure 13B:
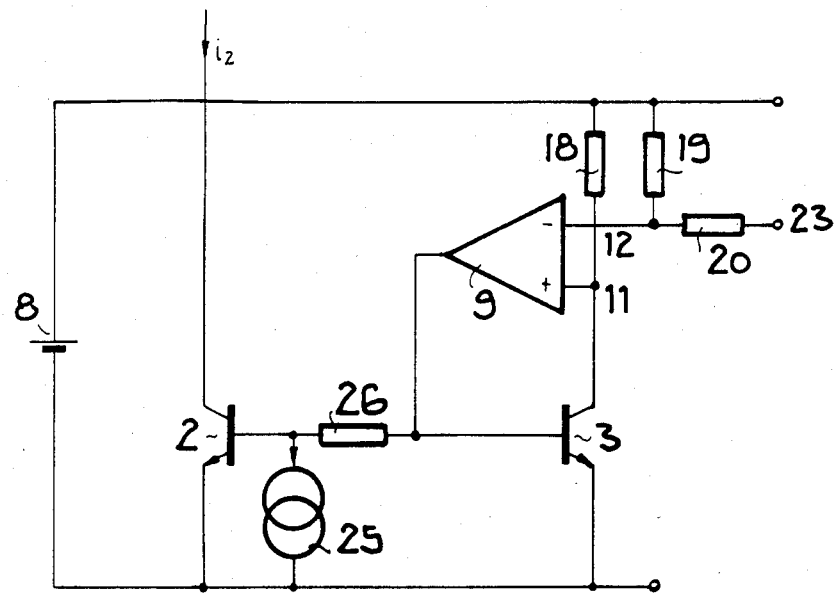
FIG. 13b shows an embodiment of the transformer circuit according to the invention for the generation of a constant voltage difference.

FIG. 13b shows an embodiment for the generation of the constant voltage difference between the base-emitter sections of the transistors 2 and 3. This voltage difference is generated in accordance with FIG. 13b by a current source 25 setting the valve of the differential voltage via a resistor 26.

Figure 14:
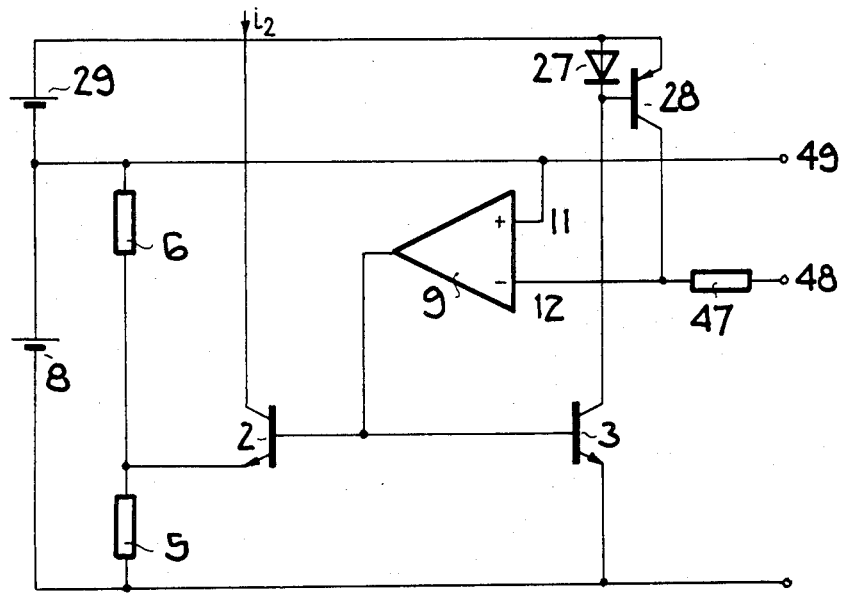
FIG. 14 shows a further embodiment of the transformer circuit according to the invention which includes a current mirror circuit for mirroring the collector current.

The circuit of FIG. 14 differs from the circuit of FIG. 12 in that a current mirror circuit with the arrangement of transistor 27 (connected as a diode) and transistor 28 mirrors the collector current of the transistor 3 to the inverting input 19 of the operational amplifier 9. Here, the non-inverting input 11 is connected to the positive pole of the voltage source 8. The current mirror circuit, wherein transistor 27 is connected as a diode, is supplied by the voltage source 29. The control signal is fed to the circuit point 12 as control current which is determined by the potential difference between the terminals 49 and 48 and also by the size of the resistance 47.

Figure 15:
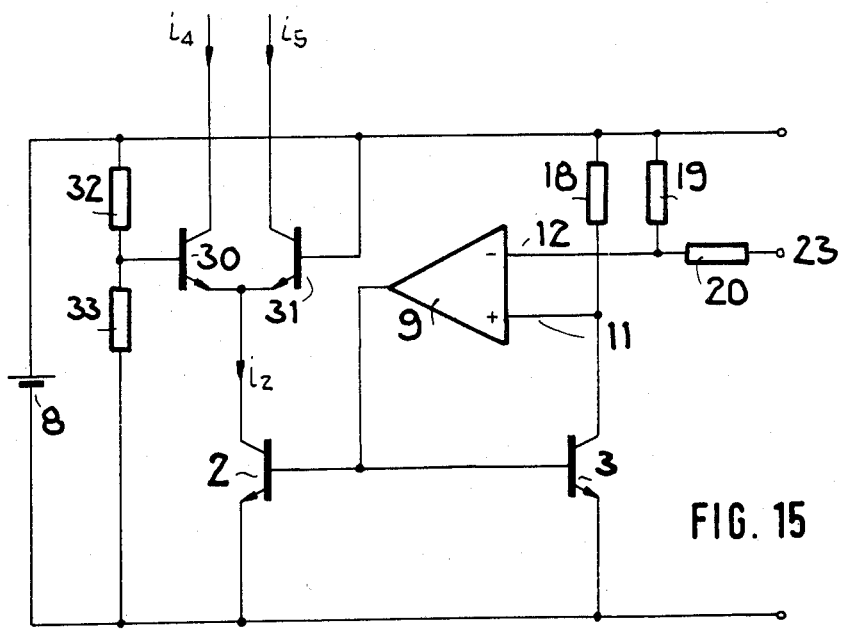
FIG. 15 shows a circuit similar to that of FIG. 12 with a further direct-current signal transformer.

The circuit of FIG. 15 differs from the circuit of FIG. 12 in that there is provided a further direct-current signal transformer consisting of the transistors 30 and 31 and also of the resistors 32 and 33. The transformed output current of this direct-current signal transformer consists of the currents $i_4$ and $i_5$.

Figure 16:
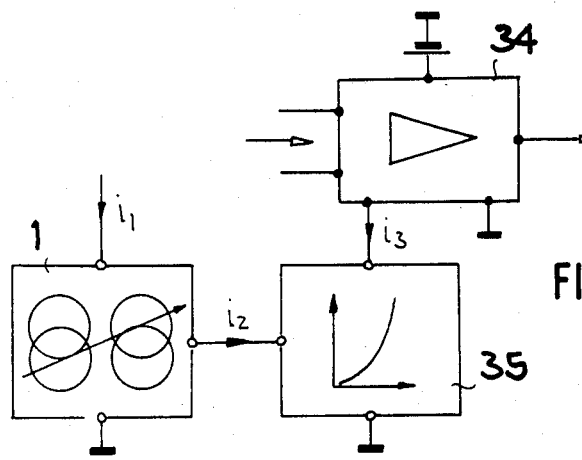
FIG. 16 is a block circuit diagram of a further embodiment of the invention which comprises an arrangement for controlling an amplifier.

In the arrangement of FIG. 16, serving to control an amplifier, there is connected between the amplifier stage 34 and the circuit 1 supplying the current $i_2$, a direct-current signal transformer 35 whose task it is to transform the output direct-current $i_2$ of the circuit 1 into an exponential current $i_3$ dependent on this current. By interposition of the direct-current signal transformer 35 there is obtained at the output of the amplifier stage 34 a signal which is exponentially dependent on the input signal $i_1$ of the circuit 1.

Figure 17:
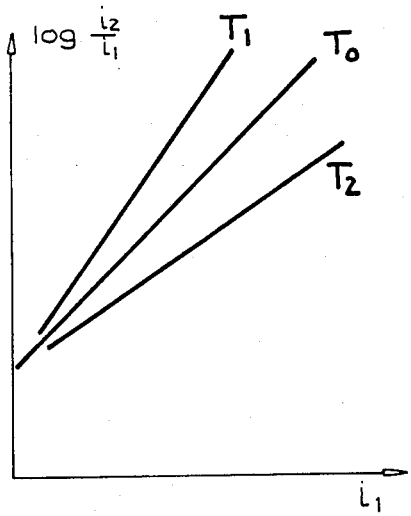
FIG. 17 is a characteristic diagram showing the current ratio $i_3/i_1$ in dependence upon $i_1$ in FIG. 16.

FIG. 17 shows on a half-logarithmic scale the current relationship $i_3/i_1$ in dependence upon $i_1$ (with interposition of a direct-current signal transformer 35). The temperature variation of the current relationship $i_3/i_1$ is dependent on the circuit 1, more particularly, on the difference of the voltages at the base-emitter sections of the transistors 2 and 3.

Figure 18:
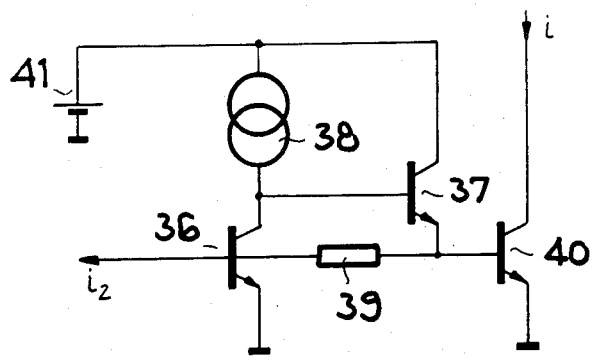
FIG. 18 is a circuit schematic for block 35 in FIG. 16 showing an inverting circuit.
Figure 22:
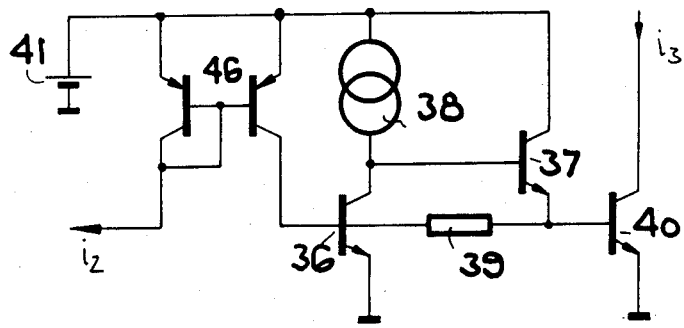
FIG. 22 is a circuit schematic of still another variation of block 35 in FIG. 16 wherein a current mirror circuit is included for mirroring the input current.

FIGS. 18 and 22 are embodiments of the direct-current signal transformer 35. The embodiment of FIG. 18 is an inverting circuit and the embodiment of FIG. 19 a non-inverting circuit. The inverting circuit of FIG. 18 consists of the transistors 36 and 37, a current source 38 and a resistor 39. The transistor 40 effects the exponential dependency of the current $i_3$ on current $i_2$ in accordance with the known characteristic curve law for transistors.

The transistors 36 and 37 in conjunction with the size of the current of the current source 38 determine the quiescent operating point of the transistor 40 without control, i.e., $i_2=0$. From a current change of $i_2$, the circuit of FIG. 18 makes a corresponding voltage change at resistor 39. There is thereby obtained at the output of the transistor 40 a current which is exponentially dependent on the input current $i_2$. The voltage source 41 supplies the operating voltage for the circuit.

Figure 19:
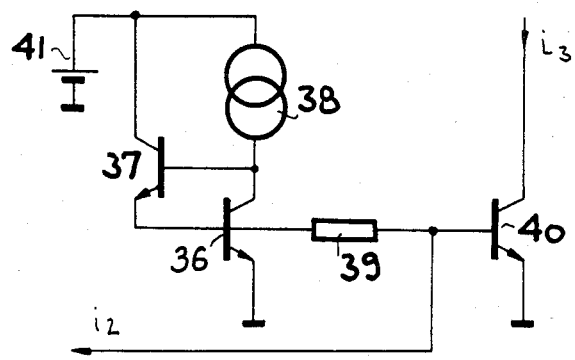
FIG. 19 is another circuit schematic for block 35 in FIG. 16 showing a non-inverting circuit.

The circuit of FIG. 19 differs from the circuit of FIG. 18 in that the current $i_2$ is not fed to the base of the transistor 36, but to the base of the transistor 40. The control effect is thereby turned around, i.e. while in the circuit of FIG. 18, the current $i_3$ increases with the current $i_2$, the current $i_3$ in the circuit of FIG. 19 decreases as the current $i_2$ increases.

Figure 20A:
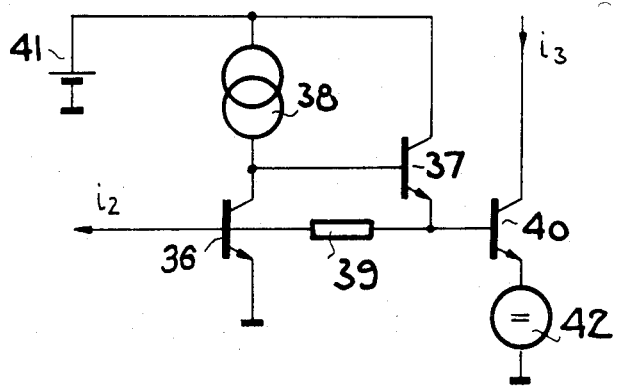
FIG. 20a is a further circuit schematic for block 35 in FIG. 16 showing an inverting circuit with a voltage source for influencing the temperature variation of a current.
Figure 20B:
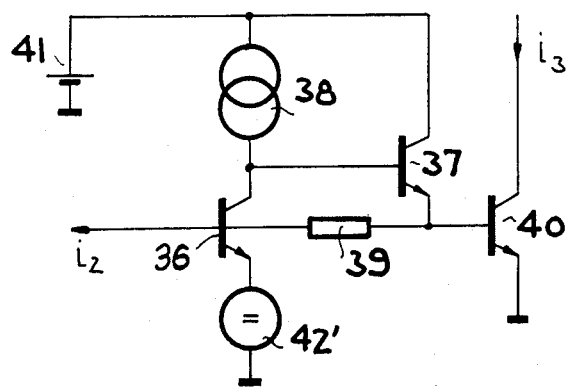
FIG. 20b shows a circuit similar to that of FIG. 20a but with a different voltage source connection.

The circuit of FIG. 20a differs from the circuit of FIG. 18 in that there is provided, in addition, a voltage source 42 which can additionally influence the temperature variation of the current $i_3$. In the circuit of FIG. 20b, the voltage source 42' is not inserted in the emitter lead of the transistor 40, but in the emitter lead of the transistor 36.

Figure 21A:
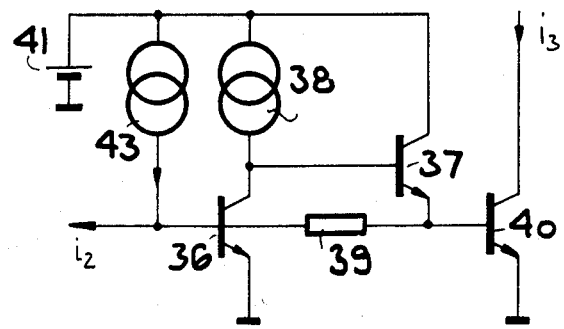
FIG. 21a is another circuit schematic for block 35 in FIG. 16 showing temperature influencing by a current source which supplies the base point of a transistor with a current.
Figure 21B:
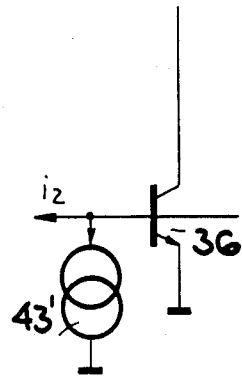
FIG. 21b is a circuit schematic showing a variation of FIG. 21a wherein temperature influencing is by a current source, with a current being taken away from the base point of a transistor.

In the arrangements of FIGS. 21a and 21b, temperature influencing is not effected by a voltage source, but by a current source 43, 43' which is connected in such a way that in the arrangement of FIG. 21a it adds a current to the base point of the transistor 36 and in the arrangement of FIG. 21b takes away a current.

Figure 21C:
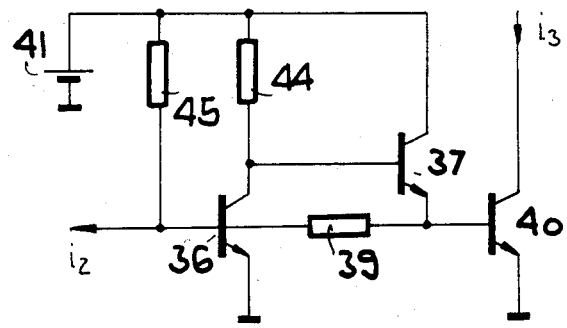
FIG. 21c is a circuit schematic of yet another variation of block 35 of FIG. 16 in which shows resistors instead of current sources.

In the circuit of FIG. 21c, the current sources 38 and 43 are replaced by resistors 44, 45. These resistors have the same purpose as the current sources in the circuit of FIG. 21a.

In the circuit of FIG. 22, the input current $i_2$ is fed via a current mirror circuit 46 to the base of the transistor 36. The current mirror circuit turns around the control effect of the input current $i_2$ in relation to $i_3$.

What is claimed is:

1. A direct current transformer circuit for producing a temperature compensated direct-current output signal, comprising:
    input means for communicating a direct-current input signal;
    output means for communicating a direct-current output signal;
    transformer means connected between said input and output means for receiving the direct-current input signal and for producing a direct-current output signal having a magnitude which is a function of the magnitude of the direct-current input signal and which is temperature dependent, said transformer means including two transistors connected to form a current mirror, each transistor developing a base to emitter voltage during operation of said transformer means, and voltage control means connected to at least one of said two transistors for regulating and setting a voltage difference between the base to emitter voltages of said two transistors for regulating and setting the magnitude of the direct current output signal to compensate for variations in current magnitude due to temperature and so that the direct-current output signal has a desired temperature characteristic.

2. A circuit according to claim 1, wherein said voltage control means comprises a voltage source connected between the bases of said two transistors.

3. A circuit according to claim 1, wherein said voltage control means comprises a voltage source connected between the emitters of said two transistors.

4. A circuit according to claim 1, wherein said voltage control means comprises one of a voltage source, a current source connected with a resistor and a voltage source connected with a voltage divider.

5. A circuit according to claim 4, wherein said two transistors have emitters with different cross-sections.

6. A circuit according to claim 5, wherein said transformer means includes a resistor is connected between the emitters of said two transistors and a reference potential, said resistor serving to set the direct-current input signal.

7. A circuit according to claim 1, wherein said two transistors are both coupled to the direct-current input signal and and each produces a direct-current output signal.

8. A circuit according to claim 7, wherein said two transistors have their emitters connected together.

9. A circuit according to claim 7, wherein said transformer means includes a control circuit for setting the potential at the emitters of said two transistors at a certain value.

10. A circuit according to claim 9, wherein said transformer means has an input for receiving the direct current input signal and potential control means for controlling the potential at said input.

11. A circuit according to claim 1, including at least two of said transformer means connected between said input and output means, direct-current signal transformers are provided.

12. A circuit according to claim 11, including a third transistor having an emitter coupled with the direct-current output signal and having a base which is kept at a constant potential.

13. A circuit according to claim 1, including a control loop and an operational amplifier means connected to the collector of one of said transistors via said control loop for controlling current at said collector.

14. A circuit according to claim 1, forming a combination with a direct-current signal transformer having an output current which changes exponentially with the direct-current input signal of said transformer means and which is connected downstream of said transformer means.

15. A combination according to claim 14, wherein said downstream direct-current signal transformer is in the form of an inverter.

16. A combination according to claim 14, wherein said downstream direct-current signal transformer has an output current which has a temperature dependency such that the temperature dependency of the inclination of the control characteristic line between the logarithm of such output current of the downstream direct-current signal transformer and its input current is compensated.

17. A combination according to claim 14, wherein said downstream direct-current signal transformer comprises two transistors and a resistor connected between the bases thereof, wherein the direct-current output signal of the upstream connected transformer means flows through said resistor.

18. A combination according to claim 14, wherein said downstream direct-current signal transformer comprises two transistors and a resistor connected between the bases thereof, the emitter of one of the transistors of said downstream direct-current signal transformer being supplied with a constant direct-current voltage which influences the temperature variation of the output current of the downstream direct-current signal transformer.

19. A combination according to claim 14, further including a current source connected to the input of said downstream direct-current signal transformer and having a current which is added to the input current of said downstream direct-current signal transformer and thereby influences the temperature variation of the output current of said downstream direct-current signal transformer.

20. A combination according to claim 14, further including a resistor which is connected to the input of said downstream direct-current signal transformer and which, as a result of a potential difference located at said resistor, supplies a current which is added to the input current of said downstream direct-current signal transformer and thereby influences the temperature variation of the output current of said downstream direct-current signal transformer.

21. A combination according to claim 14, further including further including a current mirror circuit which is connected between said transformer means and said downstream direct-current signal transformer and which reverses the control effect of the input to the downstream direct-current signal transformer.

* * * * *